United States Patent
Choe et al.

(10) Patent No.: US 8,411,078 B2
(45) Date of Patent: Apr. 2, 2013

(54) METHOD OF MODULATING/DEMODULATING A SIGNAL, APPARATUS FOR PERFORMING THE METHOD AND DISPLAY APPARATUS INCLUDING THE APPARATUS

(75) Inventors: Weon-Jun Choe, Seoul (KR); Ah-Reum Kim, Seoul (KR)

(73) Assignee: Samsung Display Co., Ltd. (KR)

( * ) Notice: Subject to any disclaimer, the term of this patent is extended or adjusted under 35 U.S.C. 154(b) by 445 days.

(21) Appl. No.: 12/758,888

(22) Filed: Apr. 13, 2010

(65) Prior Publication Data
US 2010/0265247 A1  Oct. 21, 2010

(30) Foreign Application Priority Data
Apr. 15, 2009 (KR) .......................... 10-2009-0032565

(51) Int. Cl.
*G09G 5/00* (2006.01)
(52) U.S. Cl. ...... 345/214; 327/141; 375/219; 369/47.19
(58) Field of Classification Search .................... 345/214
See application file for complete search history.

(56) References Cited

U.S. PATENT DOCUMENTS

| | | | | |
|---|---|---|---|---|
| 6,463,092 | B1* | 10/2002 | Kim et al. | 375/219 |
| 2001/0030649 | A1* | 10/2001 | Mamiya et al. | 345/530 |
| 2007/0171161 | A1* | 7/2007 | Lin | 345/87 |
| 2009/0284509 | A1* | 11/2009 | Choe | 345/208 |
| 2010/0238157 | A1* | 9/2010 | Choe et al. | 345/214 |

FOREIGN PATENT DOCUMENTS

| | | |
|---|---|---|
| JP | 2002-359613 | 12/2002 |
| KR | 10-0653159 | 11/2006 |

* cited by examiner

*Primary Examiner* — Dorothy Harris
(74) *Attorney, Agent, or Firm* — Cantor Colburn LLP

(57) ABSTRACT

In a method of modulating/demodulating a signal, a transmission signal is generated from an input data signal including data information by combining a plurality of input shift clock signals, which are modulated based on input clock signal during an interval period of the input clock signal, during 2 interval periods of the input clock signal. An output clock signal is detected and an output clock signal is generated from the transmission signal by combining a plurality of output shift clock signals, demodulated based on the output clock signal during an interval period of the output clock, during 2 interval periods of the output clock signal, to restore the data information.

17 Claims, 7 Drawing Sheets

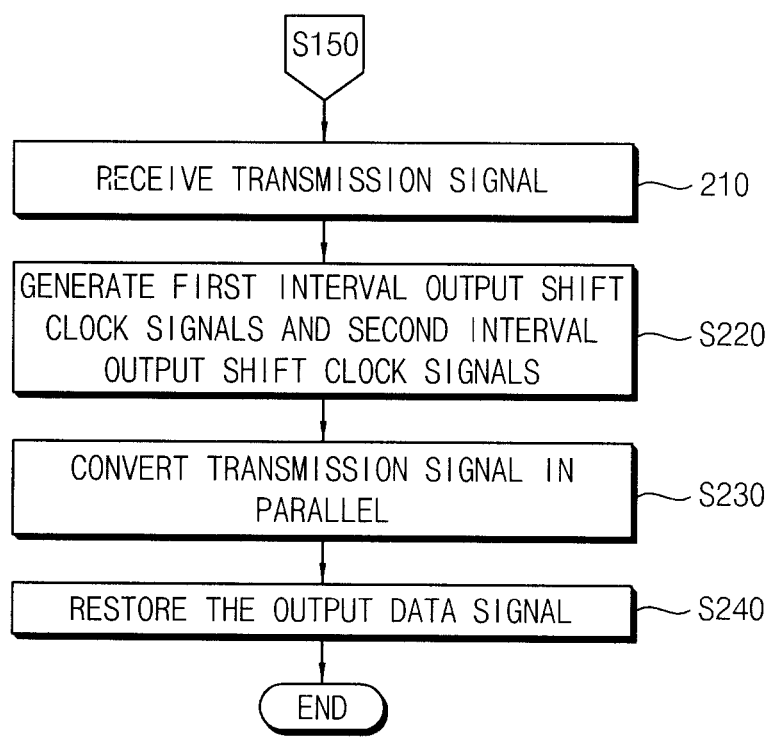

METHOD OF MODULATING/DEMODULATING A SIGNAL, APPARATUS FOR PERFORMING THE METHOD AND DISPLAY APPARATUS INCLUDING THE APPARATUS

This application claims priority to Korean Patent Application No. 2009-32565, filed on Apr. 15, 2009, and all the benefits accruing therefrom under 35 U.S.C. §119, the content of which in its entirety is herein incorporated by reference.

BACKGROUND OF THE INVENTION (1) Field of the Invention

Exemplary embodiments of the present invention relate to a method of modulating/demodulating a signal, an apparatus for performing the method and a display apparatus including the apparatus. More particularly, exemplary embodiments of the present invention relate to a method of modulating/demodulating a signal that substantially increases bit efficiency by substantially broadening a bandwidth, and an apparatus for performing the method and a display apparatus including the apparatus.

(2) Description of the Related Art

A flat panel display apparatus using liquid crystal or plasma has been developed. More particularly, flat panel display apparatuses, such as liquid crystal display ("LCD") apparatuses or plasma display apparatuses, for example, using flat panels in products such as cellular phones, computers, televisions ("TVs"), for example, have been developed.

Additionally, LCDs that display images using electrical and optical characteristics of liquid crystal have been developed to have improved resolutions and increased screen sizes.

Generally, an LCD apparatus includes a display panel that displays an image by controlling an amount of light that passes through liquid crystals and a transparent substrate. Additionally, a backlight unit ("BLU") provides the light to the display panel, and a circuit drives the display panel and the BLU. The circuit includes, for example, a gate driving circuit, a data driving circuit and a timing control circuit.

The display panel typically includes an array substrate, an opposite substrate disposed opposite to, e.g., facing, the array substrate and a liquid crystal layer disposed between the array substrate and the opposite substrate and including the liquid crystals therein. In addition, the array substrate may include a plurality of data lines, a plurality of gate lines and a plurality of pixel electrodes. The display panel typically includes an active area and peripheral area. The active area displays the image and the peripheral area surrounds at least a portion of the active area. The gate driving circuit and the data driving circuit, for example, are disposed in the peripheral area.

The gate driving circuit and the data driving circuit receive control signals from the timing control circuit disposed on the printed circuit board ("PCB") and thereby drive the display panel. In a conventional display panel, many channels for communication are required between the gate driving circuit and the data driving circuit.

When the required number of the channels is increased, power consumption is substantially increased and electromagnetic interference ("EMI") is generated.

Accordingly, a method of serially transmitting data signals has been developed in efforts to reduce the EMI and realize high-speed data transmission with low power consumption.

The method of serially transmitting data signals may transmit a clock signal and a data signal at the same time using one transmission line. The method of serially transmitting data signals may include, for example, a pulse width modulation ("PWM") method, a clock embedding modulation method or a clock edge modulation ("CEM") method.

In the CEM method, a rising edge of a clock signal is transmitted to restore a clock signal from a transmitting terminal (or a modulator) to a receiving terminal (or a demodulator). However, a position of a falling edge of the clock signal may be changed by a phase-locked loop ("PLL") circuit in the transmitting terminal (or the modulator), to represent data signals based on the position of the falling edge of the clock signal.

Accordingly, it is desired to develop a method of serially transmitting data signals that substantially increases bit efficiency and/or a bandwidth.

BRIEF SUMMARY OF THE INVENTION

An exemplary embodiment includes a method of modulating/demodulating a signal that substantially improves bit efficiency by increasing a bandwidth.

An exemplary embodiment includes an apparatus for modulating/demodulating a signal for performing the method.

An exemplary embodiment includes a display apparatus including the apparatus. An exemplary embodiment includes a method of modulating and demodulating a signal. In an exemplary embodiment, a transmission signal is generated from an input data signal including data information by combining a plurality of input shift clock signals, which are modulated based on input clock signal during an interval period of the input clock signal, during 2 interval periods of the input clock signal. An output clock signal is detected and an output clock signal is generated from the transmission signal by combining a plurality of output shift clock signals, demodulated based on the output clock signal during an interval period of the output clock, during 2 interval periods of the output clock signal, to restore the data information.

In an exemplary embodiment, in the generating a transmission signal, a first input clock signal during a first interval period may be received from the external source and generate a plurality of first interval input shift clock signals including a phase shifted from a phase of the first input clock signal. A second input clock signal during a second interval period may be received from the external source and generate a plurality of second interval input shift clock signals including a phase shifted from the phase of the second input clock signal. The input data signal may be encoded by synchronizing the input data signal to the input clock signals to generate an encoding data signal. The encoding data signal may be converted into serial data to generate a converted encoding data signal. The first interval input shift clock signals and the second interval input shift clock signals may be combined based on the converted encoding data signals to generate the transmission signal.

In an exemplary embodiment, the plurality of first interval input shift clock signals may include four different phases generated based on the first input clock signal during the first interval period, and the plurality of second interval input shift clock signals may have four different phases generated based on the second input clock signal during the second interval period.

In an exemplary embodiment, a first input shift clock signal of the plurality of first interval input shift clock signals may include substantially a same phase as a phase of the first input clock signal and forms a rising edge of the transmission signal, and a second input shift clock signal of the plurality of first interval input shift clock signals may have a phase shifted from the phase of the first input clock signal and forms a falling edge of the transmission signal during the first interval period. A first input shift clock signal of the plurality of the plurality of second interval input shift clock signals may include substantially a same phase as a phase of the second input clock signal and forms the rising edge of the transmission signal, and a second input shift clock signal of the plurality of second interval input shift clock signals may include a phase shifted from the second input clock signal and forms a falling edge of the transmission signal during the second interval period.

In an exemplary embodiment, the transmission signal may include eight 3-bit data and one special character by combining the falling edge of the transmission signal during the first interval period and the falling edge of the transmission signal during the second interval period.

In an exemplary embodiment, the special character may be identified by combining the plurality of input shift clock signals during four or more interval periods.

In an exemplary embodiment, in the detecting an output clock signal and generating an output clock signal from the transmission signal, the transmission signal may be received from the external source and a first output clock signal from the transmission signal during a first interval period and detects a second output clock signal from the transmission signal during a second interval period may be detected. A plurality of first interval output shift clock signals may be generated based on the first output clock signal detected during the first interval period, and a plurality of second interval output shift clock signals may be generated based on the second output clock signal detected during the second interval period. A phase of the plurality of first interval output shift clock signals may be shifted from a phase of the first output clock signal, and a phase of the second interval output shift clock signals may be shifted from a phase of the second output clock signal. The transmission signal may be converted into parallel data to generate a converted transmission signal, and the output data signal may be restored by combining the plurality of first interval output shift clock signals and the plurality of the second interval output shift clock signals based on the converted transmission signal.

In an exemplary embodiment, the plurality of first interval output shift clock signals may include four different phases generated based on the first output clock signal during the first interval period, and the plurality of second interval output shift clock signals may include four different phases generated based on the second output clock signal during the second interval period.

In an exemplary embodiment, a first output shift clock signal of the plurality of first interval output shift clock signals may include substantially a same phase as a phase of the first output clock signal, and may restore a rising edge of the transmission signal during the first interval period. A second output shift clock signal of the plurality of first output shift clock signals may include a phase shifted from the phase of the first output clock signal, and may restore a falling edge of the transmission signal. A first output shift clock signal of the plurality of second interval output shift clock signals may include substantially a same phase as a phase of the plurality of second interval output clock signals and restore a rising edge of the transmission signal during the second interval period, and a second output shift clock signal of the plurality of second interval output shift clock signals may include a phase shifted from the phase of the plurality of second output clock signals and restore a falling edge of the transmission signal during the second interval period.

In an exemplary embodiment, the transmission signal comprises eight 3-bit data and one special character by combining the falling edge of the transmission signal during the first interval period and the falling edge of the transmission signal during the second interval period.

In an exemplary embodiment, the special character is identified by combining the plurality of output shift clock signals during four or more interval periods.

In an alternative exemplary embodiment, a signal modulation/demodulation apparatus includes a signal modulation section and a signal demodulation section. The signal modulation section generates a transmission signal from an input data signal including data information by combining a plurality of input shift clock signals, which are modulated based on input clock signal during an interval period of the input clock signal, during 2 interval periods of the input clock signal. The signal demodulation section detects an output clock signal and generates an output clock signal from the transmission signal by combining a plurality of output shift clock signals, demodulated based on the output clock signal during an interval period of the output clock, during 2 interval periods of the output clock signal, to restore the data information.

In an exemplary embodiment, the signal modulation section may include a phase-locked loop ("PLL") circuit, an encoding part, a serial conversion part and a signal generation part. The PLL circuit may receive the input clock signal from the external source to generate a plurality of input shift clock signals including a phase shifted from a phase of the input clock signal. The encoding part may encode the input data signal by synchronizing the input data signal to the input clock signals and generate an encoding data signal. The serial conversion part may serially convert the encoding data signal provided from the encoding part and generate a converted data signal. The signal generation part may combine the plurality of input shift clock signals into two interval periods of the input clock signal based on the converted encoding data signal and thereby generate the transmission signal.

In an exemplary embodiment, the signal demodulation section may include a clock detection part, a delay-locked loop ("DLL") circuit, a parallel conversion part and a decoding part. The clock detection part may detect an output clock signal from the transmission signal. The DLL circuit may receive the output clock signal and generate a plurality of output shift clock signals based on the output clock signal. A phase of the plurality of output shift clock signals is shifted from a phase of the output clock signal. The parallel conversion part may parallelly convert the transmission signal provided from the clock detection part by synchronizing the transmission signal to the output clock signal and generate a converted transmission signal. The decoding part may combine the plurality of output shift clock signals into two interval periods of the output clock signal based on the converted transmission signal and generate the output data signal.

In an exemplary embodiment, the signal modulation section may combine a plurality of first interval input shift clock signals of the plurality of input shift clock signals during the first interval period and a plurality of second interval input shift clock signals of the plurality of input shift clock signal during the second interval period to generate eight 3-bit data and one special character.

In an exemplary embodiment, the signal demodulation section may combine the plurality of input shift clock signals during four or more interval periods to identify the special character.

According to another exemplary embodiment, a display apparatus includes a display panel, a timing control part, a signal modulation/demodulation device and a panel driving section. The display panel displays an image. The timing control part generates an input clock signal including clock information and an input data signal including data information. The signal modulation/demodulation device comprises a signal modulation section which generates a transmission signal from an input data signal including data information by combining a plurality of input shift clock signals, which are modulated based on input clock signal during an interval period of the input clock signal, during 2 interval periods of the input clock signal and a signal demodulation section which detects an output clock signal and generates an output clock signal from the transmission signal by combining a plurality of output shift clock signals, demodulated based on the output clock signal during an interval period of the output clock, during 2 interval periods of the output clock signal, to restore the data information. The panel driving section receives the output clock signal and the output data signal to drive the display panel.

In an exemplary embodiment of a method and an apparatus for modulating/demodulating a signal, and a display apparatus including the apparatus, a transmission signal including clock information and data information may be serially transmitted from a signal modulation section to a signal demodulation section at the same time using a single channel, thereby preventing skew that may be generated due to interference between signals when the clock information and data information are transmitted in parallel, and decreasing power consumption. In addition, the transmission signal is generated by combining shift clock signals during two interval periods based on an input data signal provided from the timing control part, thereby increasing the bandwidth of a serial data signal. In addition, bit efficiency is increased by increasing the bandwidth of a serial data signal.

BRIEF DESCRIPTION OF THE DRAWINGS

The above and other features and advantages of the present invention will become more readily apparent by describing in further detail exemplary embodiments thereof with reference to the accompanying drawings, in which:

FIG. 7B is a flowchart showing an exemplary embodiment of a method of demodulating a signal of the signal demodulation section of FIG. 6.

DETAILED DESCRIPTION OF THE INVENTION

Figure 1:
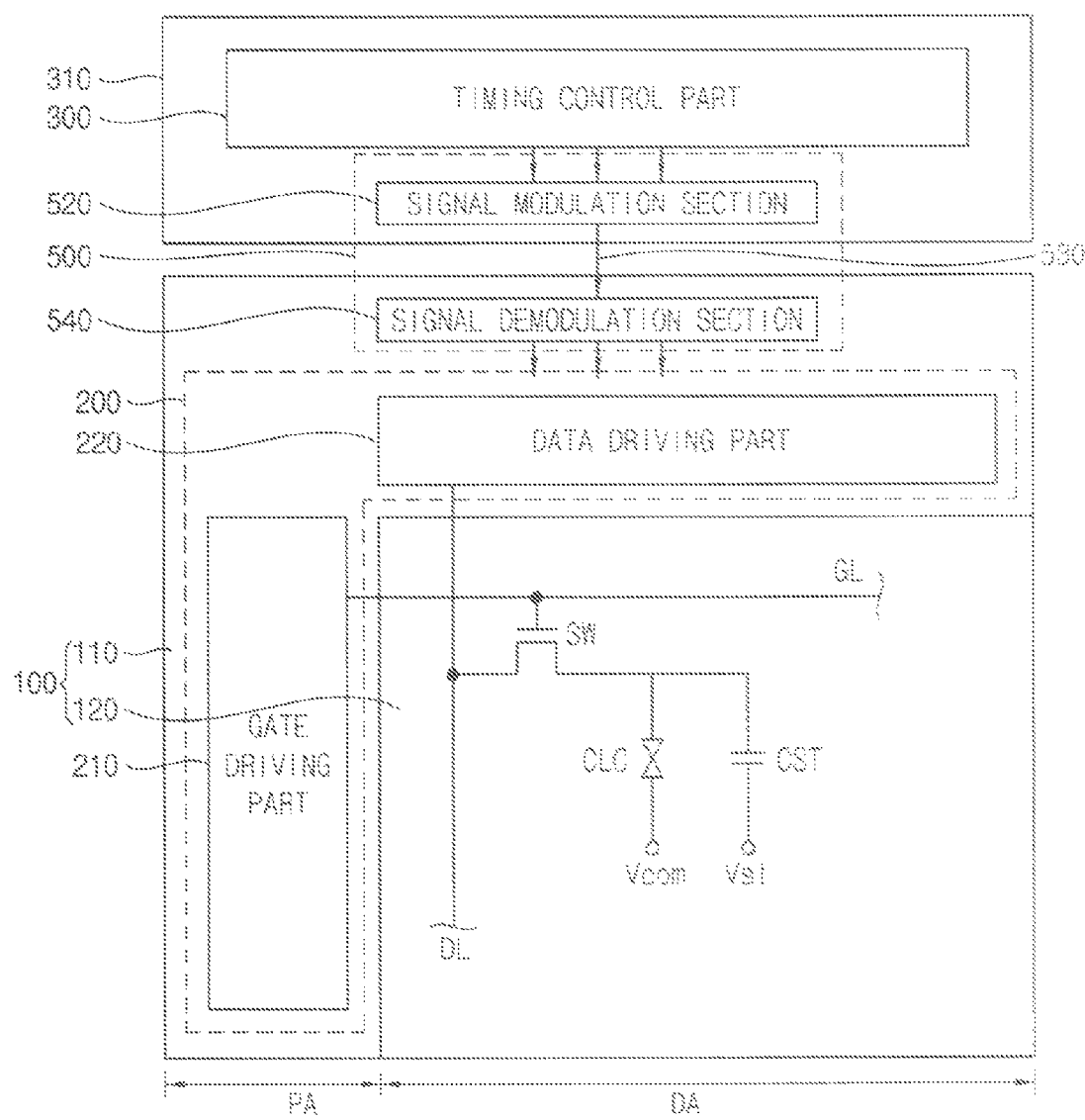
FIG. 1 is a block diagram illustrating an exemplary embodiment of a display apparatus according to the present invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the present invention will be described in further detail with reference to the accompanying drawings.

FIG. 1 is a block diagram illustrating an exemplary embodiment of a display apparatus according to the present invention.

In an exemplary embodiment, as shown in FIG. 1, a display apparatus includes a display panel 100, a panel driving section 200, a timing control part 300, a signal modulation/demodulation device 500 and a printed circuit board ("PCB") 310 which the timing control part 300 is disposed thereon.

The display panel 100 may include an array substrate, an opposite substrate 120 (for example, a color filter substrate 120) disposed opposite to, e.g., facing, the array substrate 110 and a liquid crystal layer (not shown) interposed between the array substrate 110 and the opposite substrate 120. In an exemplary embodiment, the display panel 100 includes a display area DA and a peripheral area PA. A plurality of pixels electrically connected to gate lines GL and data lines DL may be disposed on the display area DA. Each one of the plurality of pixels may include a switching element SW including a thin-film transistor ("TFT"), a liquid crystal capacitor CLC electrically connected to the switching element SW and a storage capacitor CST.

In an exemplary embodiment, the switching element SW may include a gate electrode connected to the gate line GL, a source electrode electrically connected to the data line DL, and a drain electrode electrically connected to the liquid crystal capacitor CLC and the storage capacitor CST. In an exemplary embodiment, first terminals of the data lines DL and first terminals of the gate lines GL may be disposed in the peripheral area PA.

The panel driving section 200 includes a gate driving part 210 and a data driving part 220.

The gate driving part 210 may be disposed in the peripheral area PA to output gate signals to the gate lines GL. The gate driving part 210 may include at least one gate driving chip. The at least one gate driving chip may receive a gate control signal from the timing control part 300 to drive the display panel 100. The gate driving chip may be disposed on a tape carrier package ("TCP") disposed between a PCB (not shown) and the display panel 100.

In another exemplary embodiment, the gate driving part 210 may include a shift register including cascaded stages to output the gate signals to the gate lines GL. The gate driving part 210 may be formed in an integrated circuit ("IC") integrated in the peripheral area PA. Accordingly, an additional space for disposing the gate driving part 210 is thereby not required, and a substantially slimmer display apparatus is realized.

The data driving part 220 outputs analog data signals synchronized with the gate signals to the data lines DL. In an exemplary embodiment, the data driving part 220 includes at least one data driving chip. The at least one data driving chip may be disposed on the peripheral area PA of the display panel 100 in a chip one glass ("COG") type structure. The timing control part 300 provides a data control signal to a plurality of data driving chips using a single channel 530. The plurality of data driving chips may be cascaded to use the single channel 530. In an exemplary embodiment, the plurality of data driving chips may use the single channel 530 extended from a flexible film (not shown). The single channel 530 may be extended to the gate driving chip. In an exemplary embodiment, the data driving part 220 including the plurality of data driving chip may be integrated on the peripheral area PA of the display panel 100.

Figure 2:
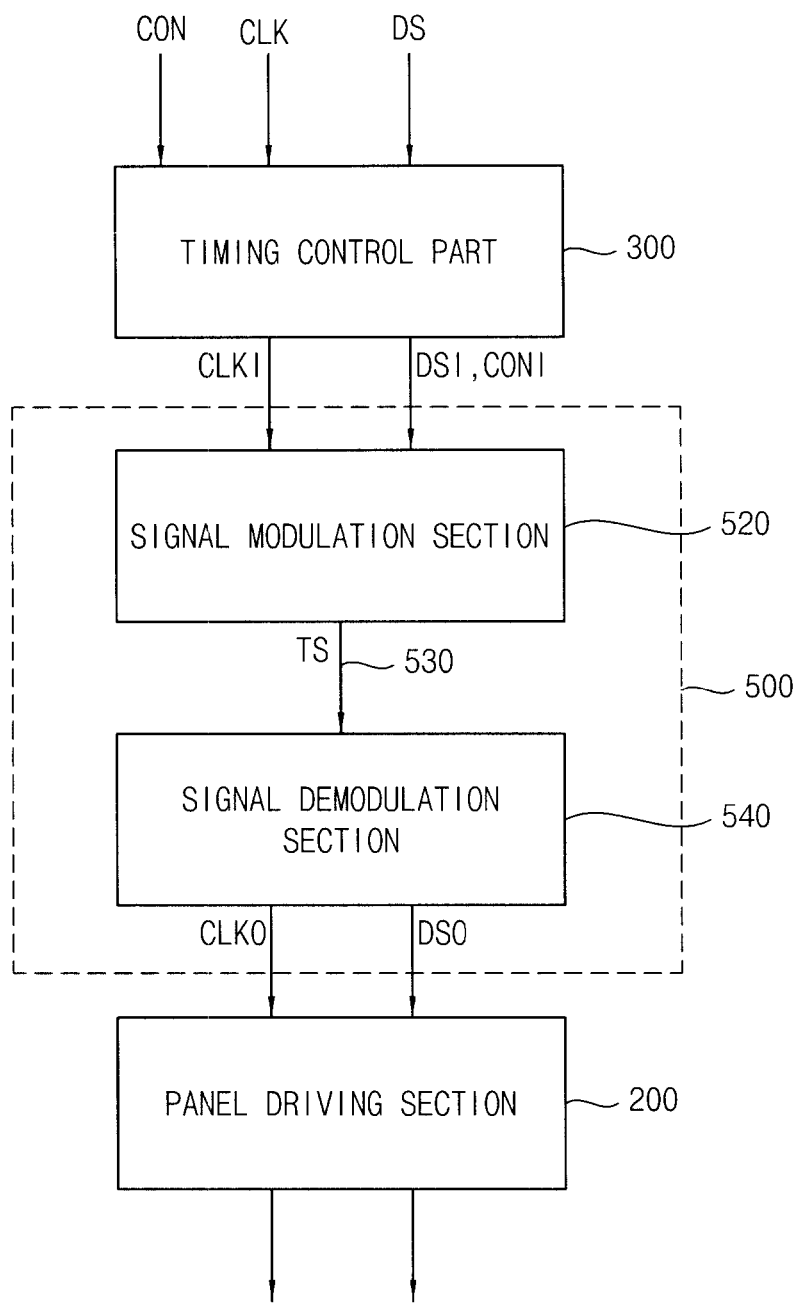
FIG. 2 is a block diagram illustrating an exemplary embodiment of a timing control part, a signal modulation/demodulation device and a panel driving part of the display apparatus shown in FIG. 1.

FIG. 2 is a block diagram illustrating an exemplary embodiment of the timing control part 300, the signal modulation/demodulation device 500 and the panel driving section 200 of FIG. 1.

In an exemplary embodiment, as shown in FIGS. 1 and 2, the timing control part 300 receives a control signal CON, a data signal DS and a clock signal CLK from an external source (not shown). The control signal CON may include, for example, a horizontal synchronizing signal, a vertical synchronizing signal, and a data enable signal. The data signal DS may include red data, green data and blue data. In an alternative exemplary embodiment, the data signal may include cyan data, magenta data and yellow data.

The timing control part 300 generates a plurality of gate control signals and a plurality of data control signals, which is in an exemplary embodiment an input data signal DSI and an input control signal CONI. The plurality of gate control signals and the plurality of data control signals control driving timings of the panel driving section 200.

The signal modulation/demodulation device 500 includes a signal modulation section 520 and a signal demodulation section 540. The signal modulation/demodulation device 500 may be disposed between the timing control part 300 and the panel driving section 200.

The signal modulation section 520 receives the plurality of gate control signals and the plurality of data control signals from the timing control part 300 and modulates the plurality of gate control signals and the plurality of data control signals into a transmission signal TS including an input clock signal CLKI received from the timing control part 300. The signal modulation section 520 transmits the transmission signal TS to the signal demodulation section 540.

In an exemplary embodiment, the transmitting signal TS includes clock information and data information. In an exemplary embodiment, a rising edge of the transmission signal TS may be formed based on the clock information, and a falling edge of the transmission signal TS may be formed based on the data information. When the panel driving section 200 receives the transmission signal TS, the rising edge may be formed in every interval period of the transmission signal TS so that the clock information may be obtained. Therefore, the signal demodulation section 540 may generate an output clock signal including the clock information from the transmission signal TS without an additional clock repair mechanism.

In addition, the data information is included in the transmission signal TS with the clock information, and thereby the transmission signal TS may be transmitted using a single channel.

The signal demodulation section 540 restores clock information and data information included in the transmission signal TS.

The panel driving section 200 includes the gate driving part 210 and the data driving part 220 of FIG. 1. Thus, the panel driving section 200 drives the display panel 100 based on the clock information and the data information provided from the signal demodulation section 540.

Figure 3:
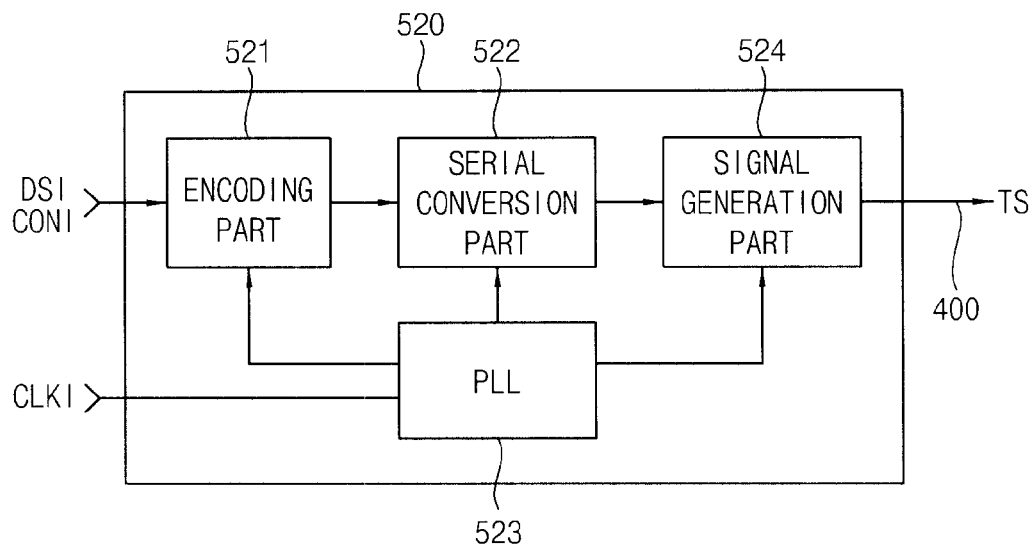
FIG. 3 is a block diagram illustrating an exemplary embodiment of a signal modulation section of FIG. 2.

FIG. 3 is a block diagram illustrating an exemplary embodiment of the signal modulation section 520 of FIG. 2.

In an exemplary embodiment, as shown in FIGS. 2 and 3, the signal modulation section 520 includes an encoding part 521, a serial conversion part 522, a phase-locked loop ("PLL") circuit 523 and a signal generation part 524.

The encoding part 521 receives the input clock signal CLKI, the input data signal DSI and the input control signal CONI from the timing control part 300. The encoding part 521 encodes the input data signal DSI in synchronization with the input clock signal CLKI.

The serial conversion part 522 converts parallel data transmitted from the encoding part 521 into serial data. In an exemplary embodiment, the parallel data may include the input data signal DSI and the input control signal CONI.

The serial conversion part 522 converts the parallel data into the serial data, and embeds a shift clock signal SCLK provided from the PLL circuit 523 to the serial data to generate the transmission signal TS.

The PLL circuit 523 receives the input clock signal CLKI from the external source, for example, the timing control part 300. The PLL circuit 523 may generate a plurality of input shift clock signals based on a system specification of the PLL circuit 523.

The PLL circuit 523 according to an exemplary embodiment may generate four input shift clock signals including four input shifted clock phases that includes a phase of the input clock signal CLKI.

The signal generation part 524 generates the transmission signal TS by combining one of first interval input shift clock signals and one of second interval input shift clock signals based on the input data signal DSI. The first interval input shift clock signals are a plurality of input shift clock signals corresponding to a first interval period of the transmission signal TS and the second interval input shift clock signals are the plurality of input shift clock signals corresponding to a second interval period of the transmission signal TS The transmission signal TS includes clock information included in the input clock signal CLKI and data information included in the input data signal DSI. In an exemplary embodiment, the rising edge of the transmission signal TS includes the clock information, and the falling edge of the transmission signal TS includes the data information. Accordingly, the one of the first interval input shift clock signals and the one of the second interval input shift clock signals are selected based on the input data signal DSI. In addition, a position of the falling edge of the transmission signal TS corresponding to the first interval period and a position of the falling edge of the transmission signal TS corresponding to the second interval period are formed based on a phase of the one of the first interval input shift clock signals and a phase of the one of the second interval input shift clock signals.

Accordingly, the transmission signal TS including the clock information and the data information may be transmitted using a single channel 530 between the signal modulation section 520 and the signal demodulation section 540.

Figure 4:
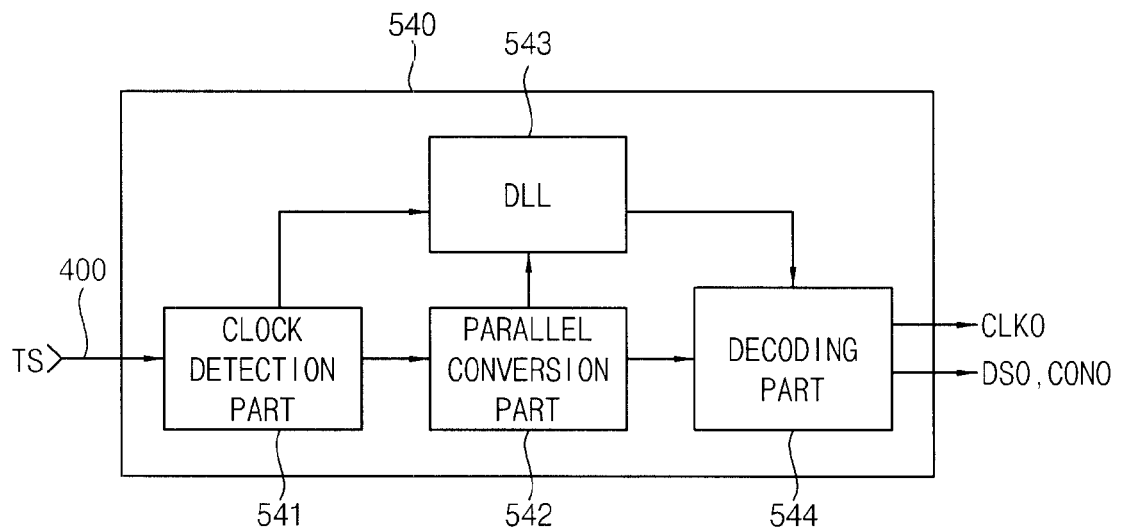
FIG. 4 is a block diagram illustrating an exemplary embodiment of a signal demodulation section of FIG. 2.

FIG. 4 is a block diagram illustrating an exemplary embodiment of the signal demodulation section 540 of FIG. 2.

In an exemplary embodiment, as shown in FIGS. 2 and 4, the signal demodulation section 540 includes a clock detection part 541, a parallel conversion part 542, a delay-locked loop ("DLL") circuit 543 and a decoding part 544.

The clock detection part 541 receives the transmission signal TS including serial data from the signal modulation section 520. The clock detection part 541 detects an output clock signal CLKO from the transmission signal TS. In an exemplary embodiment, a first output clock signal corresponding to the first interval period and a second output clock signal corresponding to the second interval period may be detected from the transmission signal TS.

The parallel conversion part 542 converts the serial data into parallel data, for example, an output data signal DSO, by synchronizing the serial data to the output clock signal CLKO generated from the clock detection part 541.

The DLL circuit 543 generates a plurality of output shift clock signals including shifted phases based on the output clock signal CLKO generated from the clock detection part 541. The DLL circuit 543 in an exemplary embodiment generates eight output shifted clock phases which are twice as much as the four input shifted clock phases generated in the signal modulation section 520. The four input shifted clock phases includes a phase of the output clock signal CLKO. The eight output shifted clock phases are generated to sample the output data signal DSO from the transmission signal TS at a position where a sampling margin is the greatest.

The decoding part 544 restores the output data signal DSO, which includes the data information, and an output control signal CONO from the parallel data by using the output shift clock signal.

Figure 5:
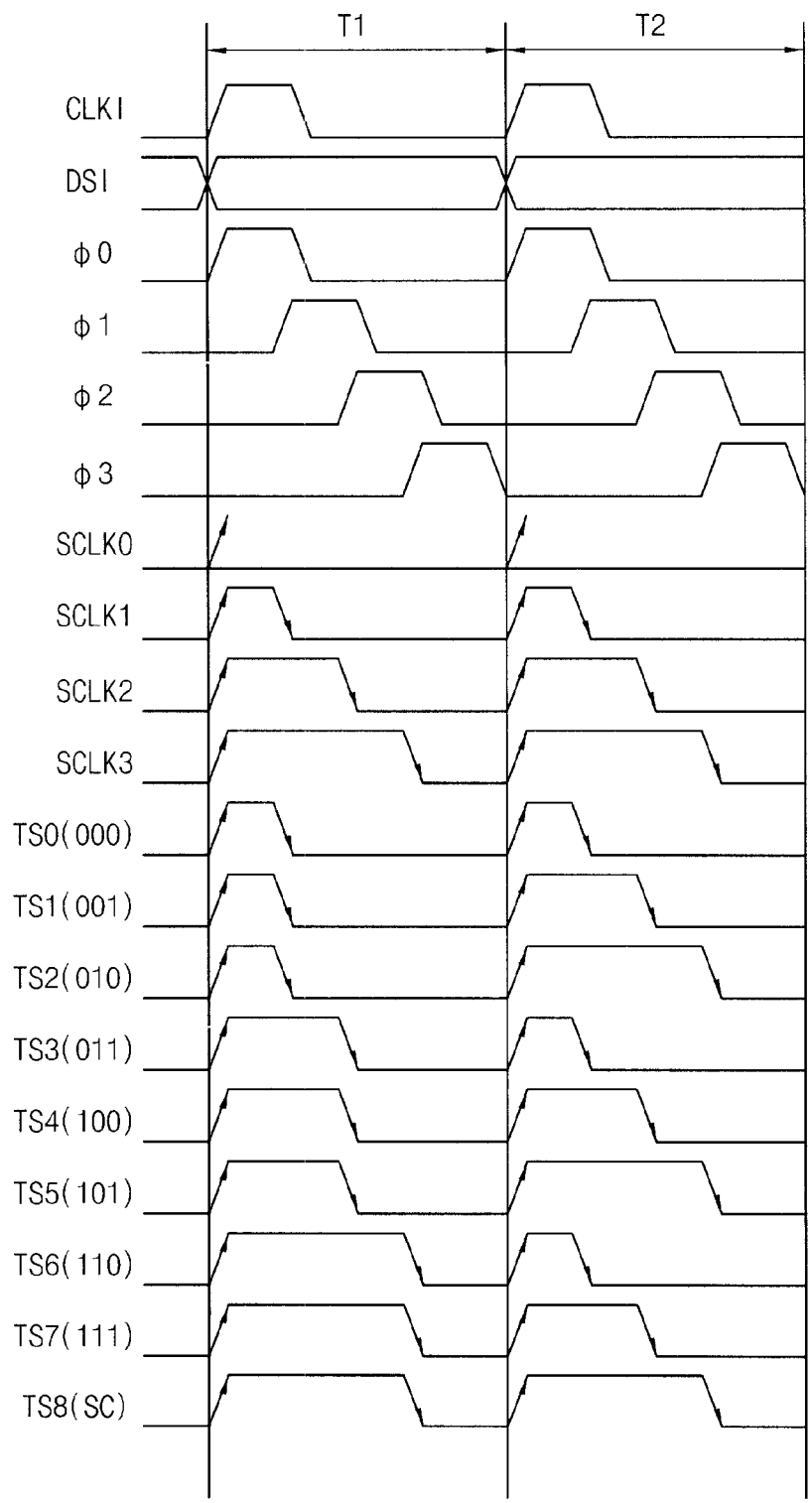
FIG. 5 is a signal timing diagram showing waveforms of input/output signals of the signal modulation section of FIG. 3.

FIG. 5 is a signal timing diagram showing wave forms of input/output signals of the signal modulation section 520 of FIG. 3.

In an exemplary embodiment, as shown in FIGS. 3 and 5, the PLL circuit 523 generates a plurality of input shift clock signals, for example, a first input shift clock signal $\phi 0$, a second input shift clock signal $\phi 1$, a third input shift clock signal $\phi 2$ and a fourth input shift clock signal $\phi 3$, based on the input clock signal CLKI. A phase of the first input shift clock signal is a same as a phase of the input clock signal CLKI. In an exemplary embodiment, during an interval period of the input clock signal CLKI, the PLL circuit 523 generates one rising edge representing the first input shift clock signal $\phi 0$ and three falling edges. The three falling edges include, for example, a first falling edge representing a second input shift clock signal $\phi 1$, a second falling edge representing a third input shift clock signal $\phi 2$ and a third falling edge representing a fourth input shift clock signal $\phi 3$. A plurality of shift clock signals are generated based on the one rising edge and the three falling edges. For example, a first shift clock signal SCLK0 may be generated based on the one rising edge, a second shift clock signal SCLK1 may be generated based on the one rising edge and the first falling edge, and a third shift clock signal SCLK2 may be generated based on the one rising edge and the second falling edge, and a fourth shift clock signal SCLK3 may be generated based the one rising edge and the third falling edge. One of the three falling edges corresponding to first interval period T1 is combined with one of the three falling edges corresponding to second interval period T2 following the first interval period T1. Accordingly, combination of the one of the three falling edges corresponding to the first interval periods T1 and the one of the three falling edges corresponding to the second interval period T2 may generate nine different signals.

The nine different signals may represent eight 3-bit data (for example, 000, 001, . . . , 111) and one special character SC.

A representation of 3-bit data by combining shift clock signals corresponding to the two interval periods has substantially higher bit efficiency than a representation of 2-bit data by using the shift clock signals corresponding to one interval period.

In an exemplary embodiment, 2-bit data may be represented by using shift clock signals corresponding to the one interval period The PLL circuit 523 requires six shift clock signals including six phases, respectively, to represent four 2-bit data and one special character SC. In an exemplary embodiment, the bit efficiency of the transmission signal TS of 2-bit data is 2 bits per one interval period.

In an exemplary embodiment, the bit efficiency of the transmission signal TS of 3-bit data corresponding to two interval periods is 3 bits per two interval periods.

Accordingly, combining of the shift clock signals during the two interval periods to represent one 3-bit data has substantially higher bit efficiency. During the same interval period T, the bandwidth of shift clock signals including four phases is substantially broader than the bandwidth of shift clock signals including six phases. Accordingly, the data information may be substantially efficiently transmitted in a high speed serial transmission using a signal representing 3-bit data.

A phase of the first input shift clock signal $\phi 0$ may be substantially identical to a phase of the input clock signal CLKI, and phases of the second input shift clock signal $\phi 1$, the third input shift clock signal $\phi 2$ and the fourth input shift clock signal $\phi 3$ may be shifted from a phase of the input clock signal CLKI.

In an exemplary embodiment, the second input shift clock signal $\phi 1$ includes a phase shifted by a first phase with respect to the phase of the first input shift clock signal $\phi 0$, the third input shift clock signal $\phi 2$ includes a phase shifted by a second phase which is twice as large as the first phase with respect to the phase of the first input shift clock signal $\phi 0$, and the fourth input shift clock signal $\phi 3$ includes a phase shifted by a third phase which is three times as large as the first phase with respect to the phase of the first input shift clock signal $\phi 0$.

The signal generation part 524 outputs the transmission signal TS. The transmission signal TS is transitioned from a low level to a high level based on the first input shift clock signal $\phi 0$ representing the clock information. In addition, the signal generation part 524 determines a falling edge of the first interval period T1, which transitions from the high level to the low level, based on one signal of the second input shift clock signal $\phi 1$ to the fourth input shift clock signal $\phi 3$ during the first interval period T1, and a falling edge of the second interval period T2 based on one signal of the second input shift clock signal $\phi 1$ to the fourth input shift clock signal $\phi 3$ during the second interval period T2, based on the input data signal DSI provided from the timing control part 300. Accordingly, the signal generation part 524 combines the falling edge of the first interval period T1 and the falling edge of the second interval period T2 to generate the 3-bit data signal, for example, the transmission signal TS.

In an exemplary embodiment, when the signal generation part 524 receives the second input shift clock signal $\phi 1$ during the first interval period T1 and the second input shift clock signal $\phi 1$ during the second interval period T2 in response to the input data signal DSI, the first transmission signal TS0 may be represented as "000".

In addition, when the signal generation part 524 receives the second input shift clock signal $\phi 1$ during the first interval period T1 and the third input shift clock signal $\phi 2$ during the second interval period T2 in response to the input data signal DSI, the second transmission signal TS1 may be represent as "001".

In addition, when the signal generation part 524 receives the second input shift clock signal $\phi 1$ during the first interval period T1 and the fourth input shift clock signal $\phi 3$ during the second interval period T2 in response to the input data signal DSI, the third transmission signal TS2 may be represented as "010".

In addition, when the signal generation part 524 receives the third input shift clock signal $\phi 2$ during the first interval period T1 and the second input shift clock signal $\phi 1$ during the second interval period T2 in response to the input data signal DSI, the fourth transmission signal TS3 may be represented as "011".

In addition, when the signal generation part 524 receives the third input shift clock signal $\phi 2$ during the first interval period T1 and the third input shift clock signal $\phi 2$ during the second interval period T2 in response to the input data signal DSI, the fifth transmission signal TS4 may be represented as "100".

In addition, when the signal generation part 524 receives the third input shift clock signal $\phi 2$ during the first interval period T1 and the third input shift clock signal $\phi 2$ during the second interval period T2 in response to the input data signal DSI, the sixth transmission signal TS5 may be represented as "101".

In addition, when the signal generation part 524 receives the fourth input shift clock signal $\phi 3$ during the first interval period T1 and the second input shift clock signal $\phi 1$ during the second interval period T2 in response to the input data signal DSI, the seventh transmission signal TS6 may be represented as "110".

In addition, when the signal generation part 524 receives the fourth input shift clock signal $\phi 3$ during the first interval period T1 and the third input shift clock signal $\phi 2$ during the second interval period T2 in response to the input data signal DSI, the eighth transmission signal TS7 may be represented as "111".

In addition, when the signal generation part 524 receives the fourth input shift clock signal $\phi 3$ during the first interval period T1 and the fourth input shift clock signal $\phi 4$ during the second interval period T2 in response to the input data signal DSI, the ninth transmission signal TS8 may be represent the special character SC.

The special character SC may determine whether the transmission signal is a data signal, a rule signal or a panel control signal.

In an exemplary embodiment, a protocol of the special character SC bit may be made more complex so as to recognize a bit boundary of the transmission signal TS in the signal demodulation section 540.

In an exemplary embodiment, the signal generation part 524 receives the third input shift clock signal $\phi 2$ during the first interval period T1 and the fourth input shift clock signal $\phi 3$ during the second interval period T2, in response to the input data signal DSI. In addition, the signal generation part 524 receives the fourth input shift clock signal $\phi 3$ during a third interval period T3 and the second input shift clock signal $\phi 1$ during a fourth interval period T4, in response to the input data signal DSI. In an exemplary embodiment, the signal demodulation section 540 may not correctly recognize the bit boundary between the second interval period T2 and the third interval period T3 of the transmission signal TS, so that the signal demodulation section 540 may incorrectly recognize the bit boundary between the first interval period T1 and the second interval period T2 or the third interval period T3 and the fourth interval period T4 as a certain special character SC.

In an exemplary embodiment, the signal generation part 524 receives the second input shift clock signal $\phi 1$ during the first interval period T1 and the fourth input shift clock signal φ3 during the second interval period T2, in response to the input data signal DSI. In addition, the signal generation part 524 receives the fourth input shift clock signal φ3 during the third interval period T3 and the third input shift clock signal φ2 during a fourth interval period T4, in response to the input data signal DSI. In the present embodiment, the signal demodulation section 540 may not correctly recognize the bit boundary between the second interval period T2 and the third interval period T3 of the transmission signal TS, so that the signal demodulation section 540 may incorrectly recognize the bit boundary between the first interval period T1 and the second interval period T2 or the third interval period T3 and the fourth interval period T4 as a certain special character SC.

Accordingly, the signal demodulation section 540 may correctly recognize the bit boundary of the transmission signal TS when the special character SC is detected over four interval periods.

In an exemplary embodiment, the signal generation part 524 receives the fourth input shift clock signal φ3 during the first interval period T1 and the fourth input shift clock signal φ3 during the second interval period T2, in response to the input data signal DSI. In addition, the signal generation part 524 receives the fourth input shift clock signal φ3 during the third interval period T3 and one of the second input shift clock signal φ1, the third input shift clock signal φ2 and the fourth input shift clock signal φ3 during the fourth interval period T4, in response to the input data signal DSI. That is, when the fourth shift clock signal φ3 is provided to the signal generation part 524 more than three intervals periods, the signal demodulation section 540 may correctly recognize the bit boundary of the transmission signal TS.

The signal demodulation section 540 generates the output shift clock signals based on the output clock signals CLKO. A process of restoring the output data signal DSO by combining the output shift clock signals during the two interval periods in the signal demodulation section 540 is the same as the process of generating the transmission signal TS in the signal modulation section 520.

Figure 6:
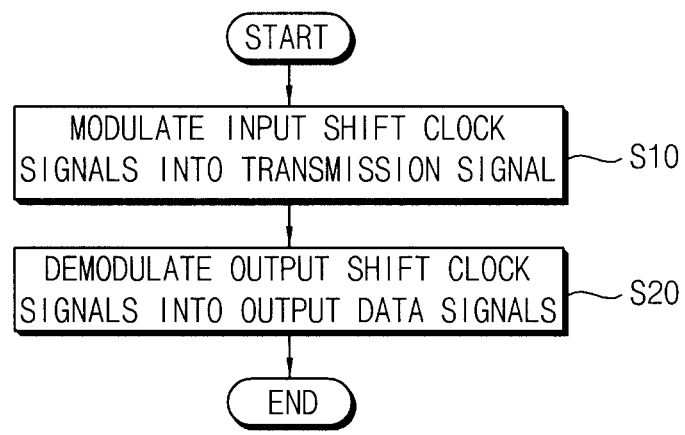
FIG. 6 is a flowchart showing an exemplary embodiment of a method of modulating/demodulating a signal of the signal modulation/demodulation device of FIG. 2.
Figure 7A:
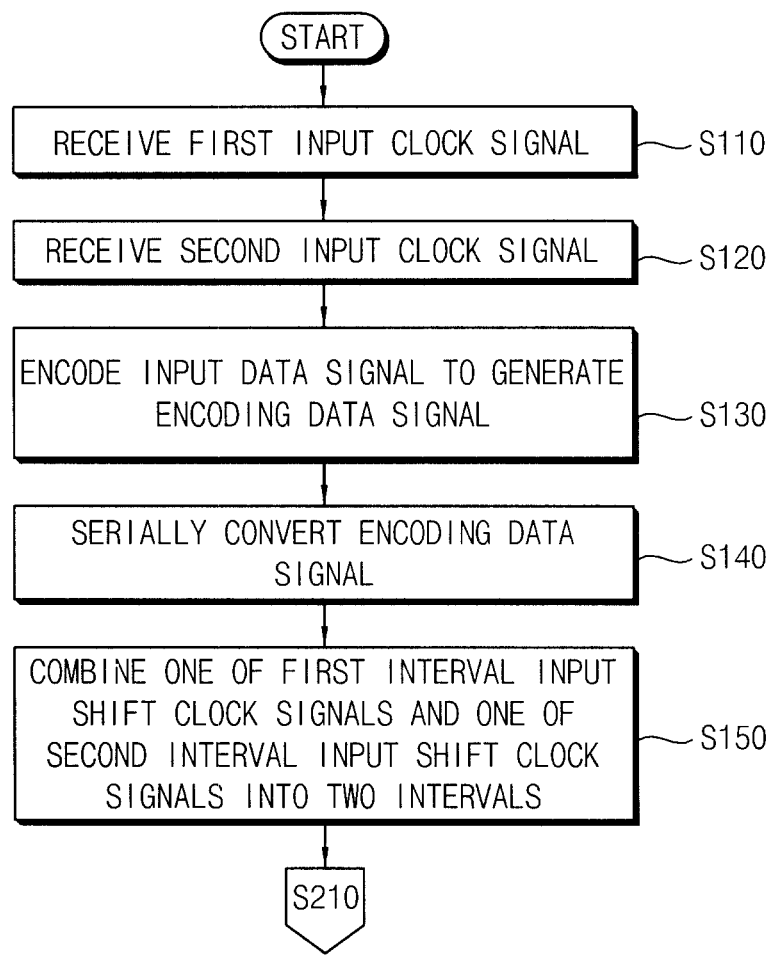
FIG. 7A is a flowchart showing an exemplary embodiment of a method of modulating a signal of the signal modulation section of FIG. 6.

FIG. 6 is a flowchart showing an exemplary embodiment of a method of modulating/demodulating a signal of the signal modulation/demodulation device of FIG. 2. FIG. 7A is a flowchart showing an exemplary embodiment of a method of modulating a signal of the signal modulation section of FIG. 6. FIG. 7B is a flowchart showing an exemplary embodiment of a method of demodulating a signal of the signal demodulation section of FIG. 6.

In an exemplary embodiment, as shown in FIGS. 2, 6 and 7A, the signal modulation section 520 receives the input clock signal, the input data signal, and the input control signal from the timing control part 300 to modulate the input clock signal, the input data signal, and the input control signal into a serial signal.

In an exemplary embodiment, the signal modulation section 520 modulates the plurality of input shift clock signals generated during a interval period of the input clock signal CLKI based on the input clock signal CLKI provided from the external source into the transmission signal TS corresponding to the input data signal DSI, by combining the plurality of input shift clock signals, into two interval periods of the input clock signal CLKI, in response to the input data signal DSI including the data information provided from the external device (step S10).

In step S10, the PLL circuit 523 of the signal modulation section 520 receives a first clock signal from the timing control part 300 during the first interval period T1 to generate the first interval input shift clock signals including the first input shift clock signal φ0, the second input shift clock signal φ1, the third input shift clock signal φ2 and the fourth input shift clock signal φ3 based on the first input clock signal (step S110).

The PLL circuit 523 receives the second input clock signal from the timing control part 300 during the second interval period T2 to generate the second interval input shift clock signals including the first input shift clock signal φ0, the second input shift clock signal φ1, the third input shift clock signal φ2, and the fourth input shift clock signals φ3 based on the second input clock signal (step S120).

The encoding part 521 receives the input data signal DSI and the input control signal CONI from the timing control part 300 to encode the input control signal CONI by synchronizing the input control signal CONI to the first input clock signal during the first interval period T1 and the second input clock signal during the second interval period T2 (step S130).

The serial conversion part 522 converts the parallel data including the input data signal DSI and the input control signal CONI, transmitted from the encoding part 521, into the serial data (step S140).

The signal generation part 524 combines one of the first interval input shift clock signals selected based on the input data signal during the first interval period T1 and one of the second interval input shift clock signals selected based on the input data signal during the second interval period T2, to generate the transmission signal TS including information of the first input clock signal and the second input clock signal (step S150).

In an exemplary embodiment, as shown in FIGS. 2, 6 and 7B, the signal demodulation section 540 receives the transmission signal TS including the serial data from the signal modulation section 520 to transmit the transmission signal TS to the panel driving section 200 in parallel.

The signal demodulation section 540 detects the output clock signal CLKO from the transmission signal TS to restore the data information, and combines a plurality of output shift clock signals generated during a interval period of the output clock signal CLKO into two interval periods of the output clock signal CLKO to demodulate the plurality of output shift clock signals into the output data signal DSO (step S210).

In step S210, the signal demodulation section 540 receives the transmission signal TS from the signal modulation section 520, and the clock detection part 541 detects the first output clock signal and the second output clock signal embedded in the transmission signal TS (step S210).

The DLL circuit 543 generates the plurality of first output shift clock signals based on the first output clock signal detected in step S210 and the plurality of second output shift clock signals based on the second output clock signals detected in step S210 (step S220).

The parallel conversion part 542 converts the serial data included in the transmission signal TS into the parallel data (step S230).

The decoding part 544 combines the output shift clock signals into the two interval periods to generate the output data signal DSO including the data information based on the transmission signal TS (step S240).

Accordingly, the clock information and the data information provided from the timing control part 300 may be converted into the transmission signal TS by the signal modulation section 520 to be serially transmitted to the signal demodulation section 540 using a single channel. In addition, the transmission signal TS may be restored into the clock information and the data information in the signal demodulation section 540 to be transmitted to the panel driving section 200 in parallel.

According to exemplary embodiments of the present invention as described herein, a transmission signal including clock information and data information may be serially transmitted from a modulation section to a signal demodulation section using a single channel, so that skew generated due to interference between signals is substantially prevented when the clock information and the data information are transmitted in parallel.

In another exemplary embodiment, the transmission signal is generated by combining shift clock signals during two intervals based on an input data signal provided from a timing control part, so that the bandwidth of a serial data signal is substantially increased.

In addition, the bandwidth of the serial data signal is substantially increased, so that bit efficiency is substantially increased.

The present invention should not be construed as being limited to the exemplary embodiments set forth herein. Rather, these exemplary embodiments are provided so that this disclosure will be thorough and complete and will fully convey the concept of the present invention to those skilled in the art.

While the present invention has been particularly shown and described with reference to exemplary embodiments thereof, it will be understood by those of ordinary skill in the art that various changes in form and details may be made therein without departing from the spirit or scope of the present invention as defined by the following claims.

What is claimed is:

1. A method of modulating and demodulating a signal, the method comprising:
   generating a transmission signal from an input data signal including data information by combining a plurality of input shift clock signals, which are modulated based on input clock signal during an interval period of the input clock signal, during 2 interval periods of the input clock signal; and
   detecting an output clock signal and generating an output clock signal from the transmission signal by combining a plurality of output shift clock signals, demodulated based on the output clock signal during an interval period of the output clock, during 2 interval periods of the output clock signal, to restore the data information,
   wherein falling edges of each of the plurality of input shift clock signals are generated during each of the interval period of the input clock signal.

2. The method of claim 1, wherein the generating a transmission signal comprises:
   receiving a first input clock signal of the input clock signals during a first interval period from an external source and generating a plurality of first interval input shift clock signals of the plurality of input shift clock signals, wherein a phase of the plurality of first interval input shift clock signals is shifted from a phase of the first input clock signal;
   receiving a second input clock signal of the input clock signals during a second interval period from the external source and generating a plurality of second interval input shift clock signals of the plurality of input shift clock signals, wherein a phase of the plurality of second interval input shift clock signals is shifted from a phase of the second input clock signal;
   generating an encoding data signal by encoding the input data signal by synchronizing the input data signal to the input clock signals;
   generating a converted encoding data signal by converting the encoding data signal into serial data; and
   generating the transmission signal by combining the plurality of first interval input shift clock signals and the plurality of second interval input shift clock signals based on the converted encoding data signal.

3. The method of claim 2, wherein the plurality of first interval input shift clock signals includes four different phases generated based on the first input clock signal during the first interval period, and
   the plurality of second interval input shift clock signals includes four different phases generated based on the second input clock signal during the second interval period.

4. The method of claim 3, wherein a first input shift clock signal of the plurality of first interval input shift clock signals includes substantially a same phase as a phase of the first input clock signal and forms a rising edge of the transmission signal, and a second input shift clock signal of the plurality of first interval input shift clock signals includes a phase shifted from the phase of the first input clock signal and forms a falling edge of the transmission signal during the first interval period, and
   a first input shift clock signal of the plurality of second interval input shift clock signals includes substantially a same phase as a phase of the second input clock signal and forms the rising edge of the transmission signal, and a second input shift clock signal of the plurality of second interval input shift clock signals includes a phase shifted from the second input clock signal and forms a falling edge of the transmission signal during the second interval period.

5. The method of claim 4, wherein the transmission signal comprises eight 3-bit data and one special character by combining the falling edge of the transmission signal during the first interval period and the falling edge of the transmission signal during the second interval period.

6. The method of claim 5, wherein the special character is identified by combining the plurality of input shift clock signals during four or more interval periods.

7. The method of claim 1, wherein the detecting an output clock signal and generating an output clock signal from the transmission signal comprises:
   receiving the transmission signal from anexternal source, detecting a first output clock signal from the transmission signal during a first interval period and detecting a second output clock signal from the transmission signal during a second interval period;
   generating a plurality of first interval output shift clock signals based on the first output clock signal during the first interval period and generating a plurality of second interval output shift clock signals based on the second output clock signal during the second interval period, wherein a phase of the plurality of first interval output shift clock signals is shifted from a phase of the first output clock signal, and a phase of the second interval output shift clock signals is shifted from a phase of the second output clock signal;
   generating a converted transmission signal by converting the transmission signal into parallel data; and
   restoring the output data signal by combining the plurality of first interval output shift clock signals and the plurality of second interval output shift clock signals based on the converted transmission signal.

8. The method of claim 7, wherein the plurality of first interval output shift clock signals includes four different phases generated based on the first output clock signal during the first interval period, and the plurality of second interval output shift clock signals includes four different phases generated based on the second output clock signal during the second interval period.

9. The method of claim 8, wherein a first output shift clock signal of the plurality of first interval output shift clock signals includes substantially a same phase as a phase of the first output clock signal and restores a rising edge of the transmission signal during the first interval period, and a second output shift clock signal of the plurality of first interval output shift clock signals includes a phase shifted from the phase of the first output clock signal and restore a falling edge of the transmission signal during the first interval period, and one second output shift clock signal of the plurality of second output shift clock signals includes substantially a same phase as a phase of the second output clock signal and restores the rising edge of the transmission signal during the second interval period, and other second output shift clock signals of the plurality of second output shift clock signals include phases shifted from the phase of the second output clock signal and restore a falling edge of the transmission signal during the second interval period.

10. The method of claim 9, wherein the transmission signal comprises eight 3-bit data and one special character by combining the falling edge of the transmission signal during the first interval period and the falling edge of the transmission signal during the second interval period.

11. The method of claim 10, wherein the special character is identified by combining the plurality of output shift clock signals during more than four interval periods of the transmission signal.

12. An apparatus for modulating and demodulating a signal, the apparatus comprising:
  a signal modulation section which generates a transmission signal from an input data signal including data information by combining a plurality of input shift clock signals, which are modulated based on input clock signal during an interval period of the input clock signal, during 2 interval periods of the input clock signal; and
  a signal demodulation section which detects an output clock signal and generates an output clock signal from the transmission signal by combining a plurality of output shift clock signals, demodulated based on the output clock signal during an interval period of the output clock, during 2 interval periods of the output clock signal, to restore the data information,
  wherein falling edges of each of the plurality of input shift clock signals are generated during each of the interval period of the input clock signal.

13. The apparatus of claim 12, wherein the signal modulation section comprises:
  a phase-locked loop circuit which receives the input clock signal from an external source and generates the plurality of input shift clock signals, wherein a phase of the plurality of input shift clock signals is shifted from a phase of the input clock signal;
  an encoding part which encodes the input data signal by synchronizing the input data signal to the input clock signal and generates an encoding data signal;
  a serial conversion part which serially converts the encoding data signal provided from the encoding part and generates a converted encoding data signal; and
  a signal generation part which combines the plurality of input shift clock signals into two interval periods of the input clock signal based on the converted encoding data signal and generates the transmission signal.

14. The apparatus of claim 12, wherein the signal demodulation section comprises:
  a clock detection part which detects an output clock signal from the transmission signal;
  a delay-locked loop circuit which receives the output clock signal and generates a plurality of output shift clock signals, wherein a phase of the plurality of output clock signals is shifted from a phase of the output clock signal;
  a parallel conversion part which parallelly converts the transmission signal provided from the clock detection part by synchronizing the transmission signal to the output clock signal and generates a converted transmission signal; and
  a decoding part which combines the plurality of output shift clock signals into two interval periods of the output clock signal based on the converted transmission signal and generates the output data signal.

15. The apparatus of claim 12, wherein the signal modulation combines a plurality of first interval input shift clock signals of the plurality of input shift clock signals during the first interval period and a plurality of second interval input shift clock signals of the plurality of input shift clock signals during the second interval period to generate eight 3-bit data and one special character.

16. The apparatus of claim 15, wherein the signal demodulation section identifies the special character by combining the plurality of input shift clock signals during more than four interval periods.

17. A display apparatus comprising:
  a display panel which displays an image;
  a timing control part which generates an input clock signal including clock information and an input data signal including data information;
  a signal modulation and demodulation device comprising:
    a signal modulation section which generates a transmission signal from an input data signal including data information by combining a plurality of input shift clock signals, which are modulated based on input clock signal during an interval period of the input clock signal, during 2 interval periods of the input clock signal; and
    a signal demodulation section which detects an output clock signal and generates an output clock signal from the transmission signal by combining a plurality of output shift clock signals, demodulated based on the output clock signal during an interval period of the output clock, during 2 interval periods of the output clock signal, to restore the data information; and
  a panel driving section which receives the output clock signal and the output data signal to drive the display panel,
  wherein falling edges of each of the plurality of input shift clock signals are generated during each of the interval period of the input clock signal.

* * * * *